(12) United States Patent
Sawai

(10) Patent No.: US 8,716,604 B2
(45) Date of Patent: May 6, 2014

(54) METAL CORE WIRING BOARD AND ELECTRIC JUNCTION BOX HAVING THE SAME

(75) Inventor: Mamoru Sawai, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 290 days.

(21) Appl. No.: 12/801,037

(22) Filed: May 18, 2010

(65) Prior Publication Data

US 2010/0294561 A1  Nov. 25, 2010

(30) Foreign Application Priority Data

May 20, 2009 (JP) ................................ 2009-122097

(51) Int. Cl.
*H05K 1/03* (2006.01)

(52) U.S. Cl.
USPC ............................ 174/255; 174/260; 439/76.2

(58) Field of Classification Search
USPC .................. 439/76.2; 174/549, 551, 255, 260
See application file for complete search history.

(56) References Cited

U.S. PATENT DOCUMENTS

| | | | | |
|---|---|---|---|---|
| 4,845,313 A * | 7/1989 | Endoh et al. | .................. | 174/261 |
| 6,655,968 B2 * | 12/2003 | Kasai | .......................... | 439/76.2 |
| 7,754,974 B2 | 7/2010 | Suzuki et al. | | |
| 7,755,911 B2 | 7/2010 | Yoshida et al. | | |
| 2005/0099778 A1* | 5/2005 | Nakanishi | ..................... | 361/704 |
| 2005/0153583 A1* | 7/2005 | Kawamura et al. | .......... | 439/76.2 |
| 2007/0126112 A1* | 6/2007 | Cho et al. | ...................... | 257/700 |
| 2008/0009154 A1* | 1/2008 | Kanou et al. | .................. | 439/76.2 |

FOREIGN PATENT DOCUMENTS

| | | |
|---|---|---|
| JP | 06-104543 | 4/1994 |
| JP | 2006-253428 A | 9/2006 |
| JP | 2006-333583 A | 12/2006 |
| JP | 2008-270466 A | 11/2008 |

OTHER PUBLICATIONS

Office Action dated Jul. 30, 2013 in Japanese Application No. 2009-122097.

* cited by examiner

*Primary Examiner* — Hung Ngo

(74) *Attorney, Agent, or Firm* — Edwards Wildman Palmer LLP; James E. Armstrong, IV; Stephen D. LeBarron

(57) ABSTRACT

An electric junction box including a metal core wiring board having a high heat-releasing property is provided. The electric junction box includes a case and a metal core wiring board received inside the case. The metal core wiring board includes a base plate and a plurality of relays. The base plate is constituted of a pair of insulation sheets sandwiching respective body portions of two conductive plates and body portions of a plurality of conductive plates. The each conductive plate has a terminal portion formed continuously from the body portion and arranged to project from edge of the insulation sheet. The conductive plates are made of copper alloy including copper and at least one of iron, nickel, tin and zirconium.

4 Claims, 3 Drawing Sheets

METAL CORE WIRING BOARD AND ELECTRIC JUNCTION BOX HAVING THE SAME

BACKGROUND

1. Field of the Invention

The present invention relates to a metal core wiring board constituting an electric junction box used to supply electric power to respective electric instruments mounted to a motor vehicle and such. The present invention further relates to an electric junction box having the above-described metal core wiring board.

2. Description of Related Art

In general, a motor vehicle is provided with various electric instruments such as lumps (head lumps, tail lumps), motors for a starter motor and an air conditioner. Therefore, in order to supply electric power to the various electric instruments, a junction block is located at suitable places in the motor vehicle. Such junction block intensively includes a variety of electric circuit units such as fuses and relays.

Since the junction block includes fuses, relays, bus bars and such, it is also called a fuse block or a relay box, or it is generically called an electric junction box. In this specification, the term electric junction box includes the above-mentioned fuse block, relay box and junction block.

The electric junction box includes a case made of an insulating composite resin and arranged to form a frame of the junction box, a printing wiring board received inside the case and provided with the variety of electric components such as above-described relays, connector blocks to which terminals of connectors of a wire harness wired in the motor vehicle are connected. The electric junction box distributes (supplies) electric power supplied by the wire harness from the power source to the respective electric instruments of the motor vehicle.

Recently, more detailed specifications of the motor vehicle are demanded in order to meet a variety of users' demands. Therefore, there is a tendency of the electric instruments of the motor vehicle being more diversified. Densely-mounted electric components and conductor patterns on the printing wiring board causes a generation of heat, and thus there was a problem of a difficulty keeping the temperature of the electric junction box within a specific temperature.

In order to solve the above-described problem, an electric junction box including a metal core wiring board having superior heat-releasing and heat-transferring properties are being proposed. Such electric junction box is disclosed in Japanese Patent Application Publication No. 2006-333583, and the electric junction box according to this prior art includes: a metal core wiring board having various electric components; and connector blocks to which terminals of connectors of a wire harness connected with electric instruments and such are connected.

The metal core wiring board of the above-mentioned prior art includes: a base plate constituted of a conductive metallic core covered by insulators, conductor patterns formed on a surface of the base plate to form a predetermined circuit patterns; and a plurality of through holes penetrating the base plate into which ends of the electric components are to be inserted. The electric components are mounted to the metal core wiring board by inserting the ends of the electric components into the through holes, respectively, and brazing with solder.

The connector block of the above-mentioned prior art includes a tubular housing and a plurality of terminal clamps received inside the housing. The respective terminal clamps are formed into an L-like shape. One ends of the terminal clamps penetrating through the metal core wiring board are brazed to the conductor patterns and the other ends of the terminal clamps are received inside the housing, thereby attaching the connector blocks to the metal core wiring board.

For the electric junction box of the above-described prior art, the metal core wiring board includes thereinside a highly heat-conductive metal core, preventing local elevation of temperature in the metal core wiring board.

However, for the electric junction box of the above-described prior art, the terminal clamps of the connector blocks needed to be attached to the metal core wiring board to connect the metal core wiring board with the external devices (electric instruments). Therefore, a thermal conductivity at connecting portions, at which the terminal clamps and the conductor patterns of the metal core wiring board are connected, is insufficient for smoothly conducting heat generated at the metal core to the terminal clamps. Thus, it is difficult to release the generated heat to an external environment. In addition, the electric junction box of the above-described prior art requires number of components and high manufacturing cost.

SUMMARY OF THE INVENTION

Therefore, in view of the above-described problems, an object of the present invention is to provide a metal core wiring board which can smoothly conduct and release heat generated at the metal core and also to provide an electric junction box having this metal core wiring board.

For achieving the object, a metal core wiring board of the present invention includes: a base plate having a plurality of metal core plates and insulators covering the plurality of metal core plates; and a plurality of electric components mounted at a surface of the base plate and arranged to connect the metal core plates in a predetermined pattern. The respective metal core plate has a body portion covered by the insulators and a terminal portion arranged to project from an edge of the insulator. The metal core plates are made of copper alloy including copper and at least one of iron, nickel, tin and zirconium.

According to the invention described above, since the respective terminal portions of the metal core plate project from the edge of the insulation sheet and are formed continuously with the respective body portion, of the metal core plate, the heat generated at the body portion of the metal core plate can smoothly be conducted to the terminal portion thereof. In other words, the heat generated at the metal core wiring board can smoothly be released to the external environment. Furthermore, since the terminal portion of the metal core plate is formed integrally with the body portion of the metal core plate, there is no need to provide terminal clamps to the connector blocks for attaching the connector blocks to the metal core wiring board. Thus, the number of components and the manufacturing cost can be reduced. Furthermore, since the metal core plates are made of copper alloy including copper and at least one of iron, nickel, tin and zirconium, the terminal portions can be strong enough to be prevented from being bent when connected with the connectors of the wire harness. Thus, the connectors of the wire harness can be securely connected to the terminal portions.

For achieving the object, an electric junction box of the present invention includes: a case; the metal core wiring board described above which is received inside the case.

According to the invention described above, since the electric junction is provided with the above-described metal core wiring board, the heat generated at the metal core wiring board can smoothly be conducted to the terminal portions and then released to the external environment.

DETAILED DESCRIPTION OF THE INVENTION

Figure 1:
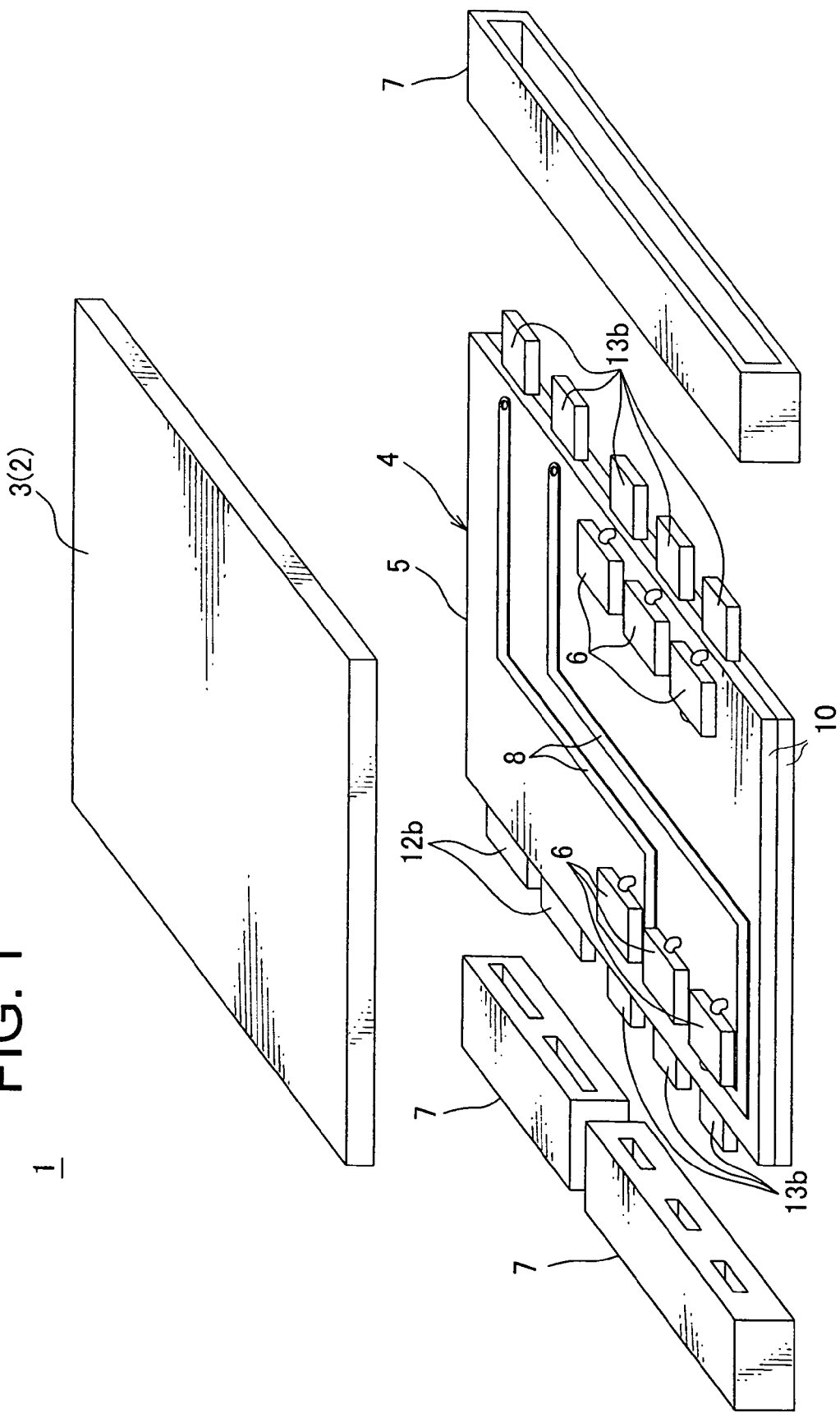
FIG. 1 is an exploded perspective view of an electric junction box of the present invention according to one embodiment.

An electric junction box of the present invention according to one embodiment will be explained below with reference to FIG. 1 through FIG. 3. The electric junction box 1 shown in FIG. 1 is mounted to a motor vehicle. The electric junction box 1, together with wire harnesses (not shown) wired to the motor vehicle, supplies (distributes) electric power from a power source of the motor vehicle to respective electric instruments mounted to the motor vehicle.

The wire harness includes a plurality of electric wires and a plurality of connectors. The electric wire includes a conductive core and an insulation cover covering the core. The connector includes a terminal clamp and a housing, the terminal clamp is attached for example to an end of the electric wire and electrically connected to the core of the electric wire.

The terminal clamp is formed by bending a conductive metal plate. The connector housing is made of an insulating synthetic resin and is formed into a box so the box has a terminal storage space storing the terminal clamp. The respective connector housings will be connected for example to later-described connector blocks 7 of the electric junction box 1, connectors of the electric instruments and the power source (battery).

The wire harnesses are wired to the motor vehicle and supply electric power from the power source to the respective electric instruments, by connecting some of the plurality of the connectors thereof to the connector blocks 7 of the electric junction box 1, and connecting the other of the plurality of the connectors to the connectors of the electric instruments and of the power source.

As shown in FIG. 1, the electric junction box 1 includes a case 2, a metal core wiring board 4 received therein, and the plurality of connector blocks 7 arranged to be mounted to the metal core wiring board 4.

The case 2 includes a plate-like upper cover 3 and a flat and bottomed tubular-shaped lower cover (not shown). The respective upper cover 3 and the lower cover are made of insulating synthetic resin and are molded using a known injection molding. The lower cover and the upper cover 3 of the case 2 are attached to each other so as to receive the metal core wiring board 4 inside the case 2 and so as to expose the connector blocks 7 outside the case 2.

The metal core wiring board 4 includes: a base plate 5 constituted of a pair of insulation sheets 10 and conductive plates 12, 13 (metal core plates); and relays 6 mounted to the base plate 5.

The conductive plates 12, 13 and the insulation sheets 10 are integrally formed to form the base plate 5, by disposing the conductive plates 12, 13 between the pair of insulation sheets 10 so as the conductive plates 12, 13 are covered by (sandwiched between) the pair of the insulation sheets 10. The each insulation sheet 10 is made for example of thermosetting insulating synthetic resin and is formed into a sheet.

Each of the conductive plates 12, 13 is made of copper alloy including copper and at least one of iron, nickel, tin and zirconium, and is formed into a flat plate. The conductive plates 12, 13 are located with a space between each other. Each of the conductive plates 12, 13 has a body portion 12a, 13a and a terminal portion 12b, 13b formed continuously with the body portion 12a; 13a. The body portions 12a, 13a are arranged to be covered by (sandwiched between) the pair of insulation sheets 10, and the terminal portions 12b, 13b are arranged to project from an edge of the insulation sheet 10. The respective body portions 12a, 13a and the respective terminal portions 12b, 13b have rectangular plane shape.

For the two conductive plates 12 which are larger than the other conductive plates 13, the respective body portions 12a thereof are positioned at middle in a width direction of the insulation sheet 10, and the respective terminal portions 12b are connected with respective terminals of the connectors of the wire harness connected with the power source. For the other conductive plates 13, the respective body portions 13a are positioned at edge portions of the insulation sheet 10 which is adjacent to both edges in the width direction of the insulation sheet 10, and the respective terminal portions 13b are connected with respective terminals of the connectors of the wire harness connected to the respective electric instruments. In this manner, the electric power from the power source is supplied to the respective two conductive plates 12. As shown in the drawings, the number of the other conductive plates 13 provided in this embodiment is eight.

Figure 2:
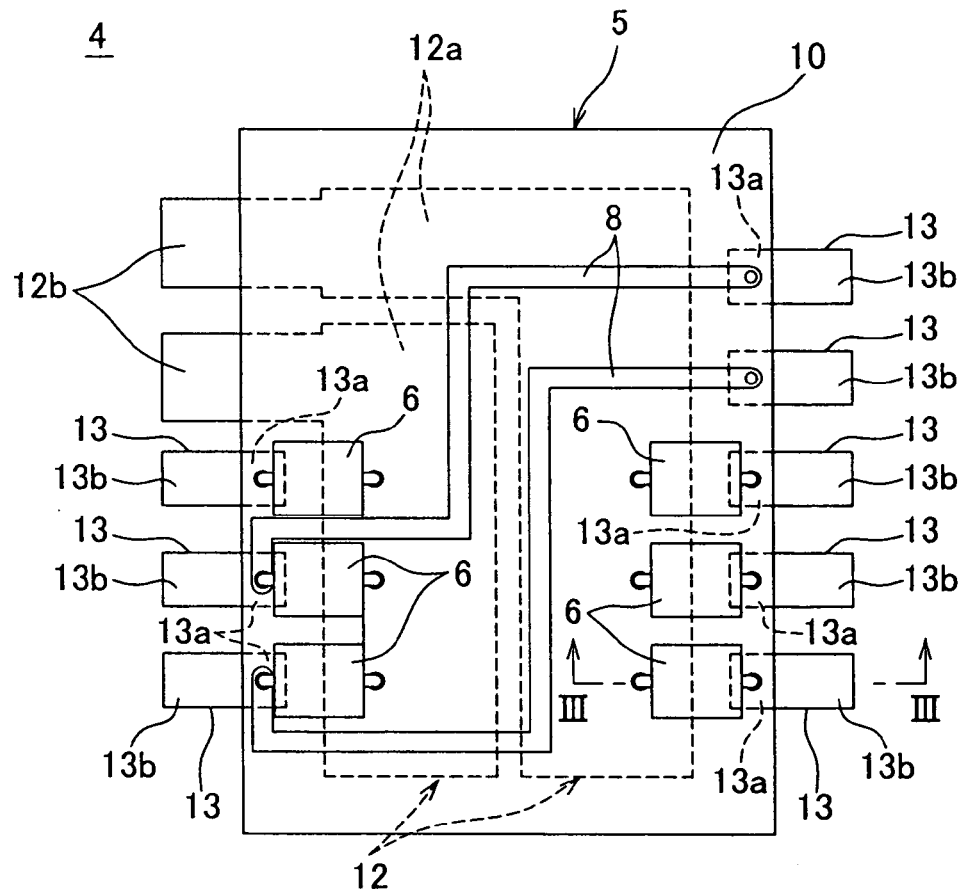
FIG. 2 is a plane view of a metal core printing wiring board of the electric junction box shown in FIG. 1.
Figure 3:
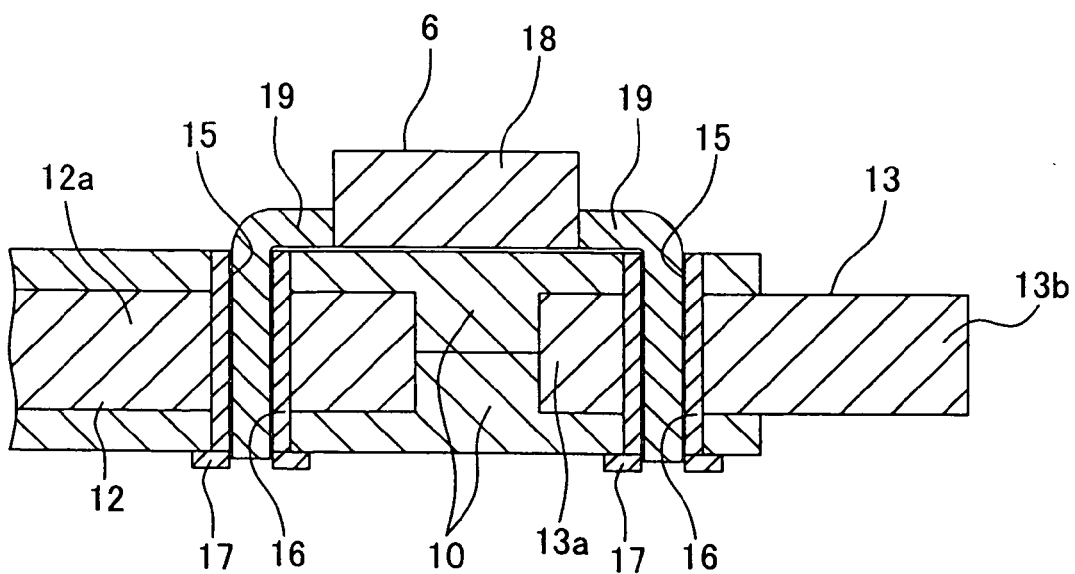
FIG. 3 is a cross-sectional view along III-III indicated in FIG. 2.
Figure 4:
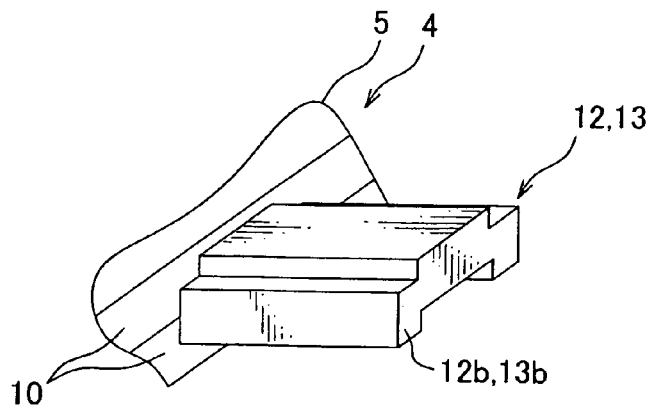
FIG. 4 is an enlarged perspective view of the metal core wiring board showing a terminal portion of a conductive plate according to another embodiment.

As shown in FIG. 2 and in FIG. 3, the base plate 5 is provided with a plurality of through holes 15. Each of the through holes 15 has a circular plane shape and penetrates through the pair of insulation sheets 10 and through the conductive plates 12, 13. An inner diameter of the each through hole 15 is formed slightly larger than an outer diameter of a later-described connecting terminal 19 of the relay 6, so that the respective connecting terminals 19 are allowed to be inserted into the respective through holes 15. An inner surface of the through hole 15 is provided with a plating 16 made of copper and such. For each through hole 15, a land 17 continued from the plating 16 is provided on a surface of the insulation sheet 10 around the through hole 15.

The each land 17 is made of conductive metal material such as copper. The each land 17 is formed into a thin film and has a ring-like plane shape. The each land 17 has a surface exposed to an external environment, so that when mounting the each relay 6 to the base plate 5 by brazing using solder (hereinafter called "soldering"), the solder can be attached to the exposed surface of the land 17. The each land 17 is connected to the each connecting terminal 19 of the relay 6 by soldering the land 17 with the connecting terminal 19 inserted into the through hole 15 soldering.

The base plate 5 further includes conductor patterns 8, as shown in FIG. 1 and FIG. 2. The respective conductor patterns 8 are a thin film made of conductive metal such as copper, and are attached to the surface of the base plate 5, as shown in FIG. 1 and FIG. 2 (that is, the surface of the upper insulation sheet 10 shown in FIG. 1). In the drawings, two conductor patterns 8 are provided. The respective two patterns 8 are provided across the base plate 5 so as to extend from the respective body portions 13a which are located on the left hand side of FIG. 2 and which are in connection with the respective body portions 12a via the relays 6, to the respective body portions 13a which are located on the right hand side of FIG. 2 and which are not in connection with the body portions 12a.

In such manner, the respective conductor patterns 8 electrically connect the respective connecting terminals 19 of the relays 6, connected to the respective body portions 13a located on the left hand side of FIG. 2, with the respective body portions 13a, not connected to the body portions 12a located on the right hand side of FIG. 2. The conductor patterns 8 can be formed into various forms depending on the circuits to be employed.

There are several (six in this embodiment) relays 6 provided, and the respective relays 6 have a cubic relay body 18 and the pair of connecting terminals 19. The respective connecting terminals 19 of the pair project from the opposing surfaces of the relay body 18. The connecting terminals 19 are made of metal such as steel. As shown in FIG. 2, each of the relays 6 is mounted to the base plate 5 with one connecting terminal 19 of the pair inserted into the through hole 15 penetrating the conductive plate 12 and soldered to the corresponding land 17, and with the other connecting terminal 19 of the pair inserted into the through hole 15 penetrating the conductive plate 13 and soldered to the corresponding land 17. The relays 6 are provided to three conductive plates 13 of each of the right and left hand sides of FIG. 2. In this manner, the relays 6 electrically connect the respective body portions 12a of the conductive plates 12 with the respective body portions 13a of the conductive plates 13.

By mounting the plurality of relays 6 to the base plate 5 and by forming the conductor patterns 8 on the surface of the base plate 5 in a manner described above, the above-described metal core wiring board 4 can electrically connect together the conductive plates 12, 13 of the base plate 5, according to a predetermined pattern which can distribute the electric power supplied to the conductive plates 12 to the respective electric instruments through the conductive plates 13. Furthermore, the metal core wiring board 4 electrically connects the respective terminal portions 12b with the respective terminals of the connectors of the wire harness connected with the power source, and the respective terminal portions 13b with the respective terminals of the connectors of the wire harness connected to the respective electric instruments.

In this manner, the metal core wiring plate 4, provided between the upper cover 3 and the lower cover to be received inside the case 2, distributes (supplies) electric power from the power source to the respective electric instruments via wire harness.

The respective connector blocks 7 are made of insulating synthetic resin and formed into a bottomed tubular shape by a known injection molding. There are three connector blocks 7 provided in this embodiment, and the respective connector blocks 7 are mounted to the base plate 5 so as to allow the terminal portions 12b, 13b to penetrate through respective bottoms of the connector blocks 7 and so as to thereby receive the terminal portions 12b, 13b inside the connector blocks 7.

In this embodiment, one of the connector blocks 7 receives the terminal portions 12b of the two conductive plates 12, and this connector block 7 is connected to the connectors of the wire harness connected with the power source. The other two of the connector blocks 7 receive the terminal portions 13b of the conductive plates 13, and these two connector blocks 7 are connected to the connectors of the wire harness connected with the electric instruments.

When assembling the above-described electric junction box 1, firstly, the plurality of relays 6 are placed at the surface of the base plate 5 of the metal core wiring board 4. Then, the respective connecting terminals 19 of the respective relays 6 are inserted into the through holes 15 and soldered with the corresponding lands 17 thereby mounting the plurality of relays 6 to the base plate 5. By mounting the plurality of relays 6 to the base plate 5, the metal core wiring board 4 can electrically connect together the conductive plates 12, 13 of the base plate 5.

Next, the respective connecting blocks 7 are mounted to the base plate 5 of the metal core wiring board 4 in a manner described above. Then, the metal core wiring board 4 is received inside the case 2, and the electric junction box 1 is assembled.

Finally, the electric junction box 1 is assembled in a manner described above and is mounted to the motor vehicle by connecting the terminals of the connectors of the wire harness to the respective connector blocks 7. The electric junction box 1, mounted to the motor vehicle in a above-this manner, divides the electric power supplied from the power source with the conductive plates 12, 13 and the relays 6 of the metal core wiring board 4 and supplies to the respective electric instruments via the wire harness.

According to this embodiment, since the terminal portions 12b, 13b projecting from the edge of the insulation sheet 10 are formed continuously with the body portions 12a, 13a of the conductive plates 12, 13, the heat generated at the body portions 12a, 13a can smoothly be conducted to the terminal portions 12b, 13b thereof. In other words, the heat generated at the metal core wiring board 4 can smoothly be release to the external environment.

Furthermore, since the terminal portions 12b, 13b are formed integrally with the body portions 12a, 13a of the conductive plates 12, 13, there is no need to provide terminal clamps to be received inside the connector blocks 7 for attaching the connector blocks 7 to the metal core wiring board 4. Thus, the number of components and the manufacturing cost can be reduced.

Furthermore, since the conductive plates 12, 13 are made of copper alloy including copper and at least one of iron, nickel, tin and zirconium, the terminal portions 12b, 13b can be strong enough to be prevented from being bent when connected with the connectors of the wire harness. Thus, the connectors of the wire harness can be securely connected to the terminal portions 12b, 13b.

Furthermore, since the electric junction box 1 according to this embodiment includes the above-described metal core wiring board 4, the electric junction box 1 allows heat generated at the metal core wiring board 4 to conduct smoothly to the terminal portions 12b, 13b, thereby smoothly releasing the generated heat to the external environment.

The conductive plates 12, 13 of the base plate 5 of the invention may be made of copper alloy in which nickel and tin are mixed with copper, or copper alloy in which zirconium is mixed with copper. In a word, the conductive plates 12, 13 of the base plate 5 according to this invention may be made of copper alloy including copper and at least one of iron, nickel, tin and zirconium.

Furthermore, the terminal portions 12b, 13b according of the invention may be pressed so as have a protruded central portion, and also thickness thereof may be adjusted.

Figure 5:
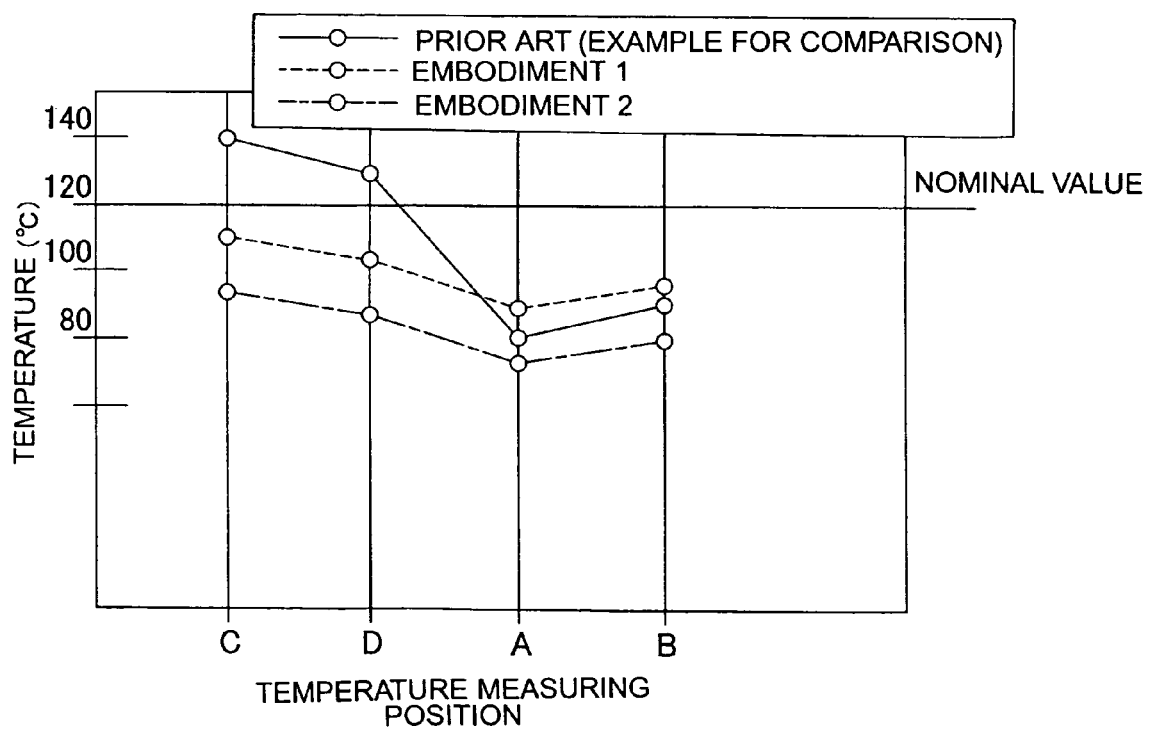
FIG. 5 is a graph showing temperature distribution for the respective metal core wiring boards according to the present invention (embodiment 1 and 2) and a prior art as a comparative example.

The inventor of the present invention had prepared two metal core wiring boards according to the present invention (Embodiment 1 and Embodiment 2), and also a metal core wiring board (Prior Art 1) which is the metal core wiring board according to the above-mentioned prior art (Japanese Patent Application Publication No. 2006-333583). Then, the effect of the present invention was examined by carrying out a below-described examination for the above-mentioned three metal core wiring boards. The results are shown in FIG. 5.

Embodiment 1 The metal core wiring board 4 of the Embodiment 1 corresponds to the metal core wiring board 4 according to the above-described embodiment. The conductive plates 12, 13 of the Embodiment 1 are made of copper alloy including 98.5 parts by mass of copper, 1.0 parts by mass of nickel and 0.05 parts by mass of tin. A hardness of the conductive plates 12, 13 of the Embodiment 1 is 160 and an electrical conductivity (IACS) thereof is 40%. The hardness is a Vickers hardness and the electrical conductivity (IACS) is a specific resistance, the specific resistance of annealed copper at 20 degrees Celsius being 100%.

Embodiment 2 The metal core wiring board 4 of the Embodiment 2 corresponds to the metal core wiring board 4 according to the above-described embodiment. The conductive plates 12, 13 of the Embodiment 2 are made of copper alloy including 99.98 parts by mass of copper and 0.02 parts by mass of zirconium. The hardness of the conductive plates 12, 13 of the Embodiment 2 is 130 and an electrical conductivity (IACS) thereof is 90%.

Prior Art 1 The metal core wiring board of the Prior Art 1 is the metal core wiring board according to the above-described embodiment (Japanese Patent Application Publication No. 2006-333583).

Test The above-described Embodiment 1, 2 and Prior Art 1 were connected to a power source and a plurality of electric instruments, respectively, and then, for the respective Embodiment 1, 2 and Prior Art 1, a voltage supplied from the power source was distributed (supplied) to the plurality of electric instruments.

Temperatures of a plurality of positions on the conductive plates 12, 13 were measured. The temperatures were measured at: the body portion 12a (position A); the connecting terminal 19 of the relay 6 connected to the conductive plate 13 located on the left hand side in FIG. 2 (position D); an end of the terminal portion 13b of the conductive plate 13 located on the left hand side connected directly by the relay 6 and the connecting terminal 19 (position A); and an end of the terminal portion 13b of the conductive plate 13 located on the left hand side connected with the relay 6 and the conductive pattern 8 (position B). The measurement results were shown in FIG. 5. The horizontal axis indicates the respective positions A through D, and the vertical axis indicates the temperature (in degrees Celsius).

As shown in a graph of FIG. 5, for the Prior Art 1, the temperatures at the position C and D exceeded a nominal value, that is 120 degrees C. Consequently, for the Prior Art 1, a local elevation of temperature exceeding the nominal value (120 degrees C.) will generate on the base plate of the metal core wiring board.

On the other hand, for the Embodiment 1 and 2, the temperatures at all positions A, B, C and D were below the nominal value (120 degrees C.). Also, temperature differences between the temperatures of the respective positions A, B, C and D are small, that is, a temperature distribution is almost uniform. Furthermore, the measured temperatures are lower than the Prior Art 1.

The measurement results in the test showed that the metal core wiring board 4 having a substantially uniform temperature distribution can be obtained with the conductive plates 12, 13 made of copper alloy including copper and at least one of iron, nickel, tin and zirconium. Therefore, the test showed that the metal core wiring board 4 which can smoothly release the heat generated at the metal core wiring board to the external environment, cab be obtained.

The above-described embodiment is just a representative embodiment, and the present invention is not limited to this embodiment. That is, the present invention can be modified and performed within the scope of the invention.

The invention claimed is:

1. A metal core wiring board comprising:
a base plate having a plurality of first metal core plates, a plurality of second metal core plates and insulators covering both the plurality of first and second metal core plates;
a first set of electric components mounted at a surface of the base plate and arranged to connect a first metal core plate of the first plurality of metal core plates to a first set of the second plurality of metal core plates in a predetermined pattern; and
a second set of electric components mounted at a surface of the base plate and arranged to connect a second metal core plate of the first plurality of metal core plates to a second set of the second plurality of metal core plates in a predetermined pattern,
wherein the respective metal core plates each have a body portion covered by the insulators, and a terminal portion formed continuously from the body portion as one piece of material and arranged to project from an edge of the insulator, and each terminal is connected to a different metal core plate and each metal core plate is formed with a space between each other, and
wherein the metal core plates are made of copper alloy including copper and at least one of iron, nickel, tin and zirconium.

2. An electric junction box comprising: a case; a metal core wiring board received inside the case, said metal core wiring board including a plurality of electric components mounted thereto; and a connector block attached to the metal core wiring board, wherein said metal core wiring board is according to claim 1, wherein the terminal portions of the metal core plates are received in the connector block, and the external connector is connected to said connector block.

3. The metal core wiring board according to claim 1, wherein each terminal portion on both the first plurality of metal core plates and the second plurality of metal core plates in the metal core wiring board extends along a same plane as each body portion to form a continuously flat surface.

4. The metal core wiring board according to claim 1, wherein the terminal portions of the metal core plates are received in the connector block, and the external connector is connected to said connector block.

* * * * *